(12) United States Patent
Takeyama et al.

(10) Patent No.: US 6,388,937 B2
(45) Date of Patent: May 14, 2002

(54) SEMICONDUCTOR MEMORY DEVICE

(75) Inventors: Yoshikazu Takeyama, Fujisawa; Takayuki Harima, Kawaguchi, both of (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/812,361

(22) Filed: Mar. 20, 2001

(30) Foreign Application Priority Data

Mar. 28, 2000 (JP) ........................................ 2000-089561

(51) Int. Cl.$^7$ ................................................. G11C 8/00
(52) U.S. Cl. .............................. 365/230.03; 365/230.06; 365/236; 365/238.5
(58) Field of Search ........................ 365/230.03, 230.06, 365/236, 238.5

(56) References Cited

U.S. PATENT DOCUMENTS 6,067,260 A * 5/2000 Ooishi .................... 365/230.03

FOREIGN PATENT DOCUMENTS

JP 10-275477 10/1998
JP 11-162174 6/1999

* cited by examiner

Primary Examiner—Tan T. Nguyen
(74) Attorney, Agent, or Firm—Hogan & Hartson, L.L.P.

(57) ABSTRACT

A semiconductor memory device according to the present invention includes a burst counter for sequentially automatically generating an address of a predetermined bit number in synchronism with a clock on the basis of a predetermined sequence in the subsequent operation cycle in accordance with the inputted initial address, and a plurality of memory cell sub-arrays which is formed by dividing a memory cell array. The semiconductor memory device further comprises a plurality of block decoder selection-time adjusting circuits for sequentially outputting a first block selecting signal, which is the base of a signal for selecting each of the memory cell sub-arrays, as a second block selecting signal at a timing corresponding to a read latency and for outputting the first block selecting signal as a third block selecting signal which has a length corresponding to the read latency.

10 Claims, 6 Drawing Sheets

SEMICONDUCTOR MEMORY DEVICE

CROSS REFERENCE TO RELATED APPLICATIONS

The subject application is related to subject matter disclosed in Japanese Patent Application No. 2000-89561 filed on Mar. 28, 2000 in Japan to which the subject application claims priority under Paris Convention and which is incorporated herein by reference.

BACKGROUND OF THE INVENTION

1. Field of The Invention

The present invention relates generally to a synchronous type semiconductor memory device which operates in a burst mode in synchronism with a clock signal. More specifically, the invention relates to a synchronous type semiconductor memory device wherein a data reading operation corresponding to read latency is accelerated.

2. Related Background Art

As the working speed of CPUs for use in computers is accelerated every year, rapidly operatable SRAMs are often being used as cache memories required to follow the operation of rapid CPUs. In such cases, SRAMs used as cache memories are often synchronous SRAMs which operate in synchronism with external clocks.

In order to allow a more rapid operation than the operation in a usual random access, the following two architectures are sometimes adopted.

First, there is a burst sequence for sequentially automatically generating addresses of a predetermine bit number on the basis of a predetermined sequence in synchronism with clocks in the subsequent operation cycle in accordance with an initial address inputted from the outside. In this burst operation, it is not required to incorporate addresses from the outside every operation cycle, and a rapid operation is realized by assigning the burst address to the fastest system in a memory cell selecting path.

Secondary, there is a read latency which is the setting how many cycles after a cycle in which an address is inputted from the outside, data should be outputted. By increasing the number of cycles, i.e., a read latency, in a predetermined period of time until the initial data are outputted after an address is inputted from the outside, it is possible to increase the operating frequency.

FIG. 1 is a block diagram showing the construction of a conventional synchronous SRAM.

The conventional synchronous SRAM comprises: n×m memory cells C11, . . . , Cnm provided in the form of a matrix; a row decoder RD for outputting a row selecting signal for selecting one of the memory cells in each row; word lines WL1, . . . , WLn, connected to the memory cells in each row and the row decoder RD, for transmitting the row selecting signal; a column decoder CD for decoding an input address to a column selecting signal for selecting one of the memory cells in each column, to output the column selecting signal; a burst counter BC for sequentially automatically generating an address of a predetermined bit number in synchronism with a clock on the basis of a predetermined sequence in the subsequent operation cycle in accordance with the inputted initial address, to output the generated address to the column decoder; a column register CRG for outputting the column selecting signal, which is inputted from the column decoder CD, at a predetermined timing; column selecting signal lines YS1, . . . , YSm, connected to the column register CRG, for transmitting the column selecting signal; bit line pairs BL1, BL1B, . . . , BLm, BLMB, which are connected to the memory cells in each column and which comprise bit lines and inversion-side bit lines for transmitting a data signal when data are inputted to and outputted from the memory cells; bit line peripheral circuits CA1, . . . , CAm which are connected to the respective bit line pairs and the respective column selecting signal lines and to which the column selecting signal is inputted, the data signal transmitted by the bit line pairs being inputted to and outputted from the bit line bit line peripheral circuits CA1, . . . , CAm; a data bus pair comprising a data bus DL and inversion-side data bus DLB which are connected to the respective bit line pairs via the respective bit line peripheral circuits; a reading circuit RC for reading data out of the respective memory cells via the bit line pairs, the bit line peripheral circuits and data bus pair, to amplify and output the read data; a data output register RGOUT for outputting data, which are amplified by the reading circuit RC, to an input/output port I/O at a predetermined timing; a data input register RGIN for outputting data, which are inputted from the input/output port I/O, at a predetermined timing; and a writing circuit WC for amplifying and outputting data, which are inputted from the data input register RGIN, to write the data in each of the memory cells via the data bus pair, bit line peripheral circuits and bit line pairs.

As an example of the construction of each of the memory cells C11, . . . , Cnm, the construction of the first-row, first-column memory cell C11 will be described. The memory cell C11 comprises: first and second inverters INV11a and INV11b which are connected to each other as a cycle; a first transfer switch TS11 comprising an N-channel MOS transistor which is provided between the first-column bit line BL1 and the input node of the first inverter Inv11a, and the gate of which is connected to the first-row word line WL1; and a first inversion-side transfer switch TS11B comprising an N-channel MOS transistor which is provided between the first-column inversion-side bit line BL1B and the input node of the second inverter INV11b, and the gate of which is connected to the first-row word line WL1. The first and second inverters INV11a and INV11b constitute a flip-flop. Each of the other memory cells has the same construction.

Each of the bit line peripheral circuits CA1, . . . , CAm comprises: a column switch for connecting and disconnecting between the respective bit lines and inversion-side bit lines, and the data bus DL and inversion-side data bus DLB; a pre-charging circuit for pre-charging the respective bit lines and inversion-side bit lines; and an equalizing circuit for equalizing the respective bit lines and inversion-side bit lines. The column selecting signal is inputted to the column switch, so that the connection and disconnection between the respective bit lines and inversion-side bit lines, and the data bus DL and inversion-side data bus DLB is controlled.

FIG. 2 is a timing chart showing the waveforms of principal signals in the conventional synchronous SRAM shown in FIG. 1. The signal waveforms shown in FIG. 2 include the waveforms of a clock signal CLK, an address signal Add, a row selecting signal for the first-row word line WL1, a potential of each of the bit lines BL and inversion-side bit lines BLB, column selecting signals for the column selecting signal lines YS1, YS2, YS3 and YS4, and a data signal DATA in the input/output port I/O.

Referring to FIG. 2, a data reading operation in the conventional synchronous SRAM will be described below.

When an address signal Add is inputted in synchronism with the leading edge of a clock signal CLK at a start time t0 in the initial cycle T1 during a reading operation in a memory cell, decode signals are generated by the row decoder RD and column decoder CD as a row selecting signal and a column selecting signal, respectively.

Assuming herein that a word line selected by the row selecting signal is the first-row word line WL1, the transfer switches of the memory cells C11, C12, . . . , C1m connected to the first-row word line WL1 are turned on by the row selecting signal transmitted by the first-row word line WL1. Then, a current flows into the low potential side of the flip-flops constituting the selected memory cells via the transfer switches. As a result, the potential of one of the bit line pairs BL and BLB, which have been pre-charged at a high potential and equalized, is lowered to cause a potential difference between the pair of bit lines BL and BLB. At this time, the reading circuit RC holds a preparatory state in which data read in the preceding reading operation are canceled.

In the second cycle T2, the column selecting signal generated by the column decoder CD in the first cycle T1 is outputted to the selected column selecting signal line via the column register CRG. Assuming that the selected column selecting signal line is the first column selecting line YS1, the column selecting signal is inputted to the column switch of the first-column bit line peripheral circuit CA1 via the first column selecting signal line YS1, so that the column switch of the first-column bit line peripheral circuit CA1 is turned on. Substantially simultaneously therewith, a minute potential difference caused between the pair of bit lines BL1 and BL1B is propagated to the data bus pair DL and DLB to activate the reading circuit RC to amplify the minute potential difference.

In the third cycle T3, the data DATA amplified by the reading circuit RC are outputted to the input/output port I/O via the data output register RGOUT.

Furthermore, the example of the reading operation shown in FIG. 2 is a reading operation in the case of a read latency of 4.

An operation based on a burst sequence will be described below.

When the initial address is inputted to the column decoder CD, an address of a predetermined bit number is inputted to the burst counter in accordance therewith, so that an address of a predetermined bit number is sequentially automatically generated in synchronism with the clock signal CLK in the subsequent operation cycle. In the example of the reading operation shown in FIG. 2, after the second cycle T2, a column selecting signals is selected in accordance with the initial address on the basis of a predetermined burst sequence. Then, the column selecting signal is outputted via the column register CRG as a column address based on a predetermined burst sequence in or after the next operation cycle, so that the reading operation continues to be carried out in accordance with the column address.

In the above described circuit operation, in order to accelerate the reading operation in the case of the read latency of 4, the following device is added.

After the initial address is incorporated to select the word line, a potential difference between the pair of bit lines is generated, and the potential difference increases with the elapse of time. The reading circuit RC is designed to amplify the potential difference between the pair of bit lines. As the potential difference increases, the operation margin of the reading circuit RC is improved. Since the potential difference $\Delta V1$ between the pair of bit lines at the initial burst address after selecting the word line is minimum, the operation margin of the reading circuit RC is minimum.

Therefore, two cycles are applied to a reading operation in a memory cell corresponding to the first burst address at which the operation margin is minimum, and one cycle is applied to a reading operation in a memory cell corresponding to the subsequent burst address. The number of cycles based on the operation specification of the read latency, i.e., the number of cycles until data corresponding to the initial address are outputted after the initial address is incorporated, is spent on the data reading cycle corresponding to the initial burst address at which the operation margin is minimum, so that the acceleration of the reading operation is realized.

However, since a special sequence is adopted for only the reading operation corresponding to the initial address without reading all of output data are in the same operation sequence, the number of elements, which must be taken into consideration in the operation analysis, increases to complicate the analysis, so that there is a problem in that the system circuit and the setting of the internal timing are complicated.

In the above described reading operation, during the operation based on the burst sequence, the word line continues to be selected until the burst sequence of predetermined bits is completed. Since current continues to flow through the memory cells while the word line is selected, there is also a problem in that current consumption increases.

SUMMARY OF THE INVENTION

It is therefore an object of the present invention to realize the simplification of a system circuit and the facilitation of an operation analysis according thereto, by using the same sequence as a reading operation in each of operation cycles based on a burst sequence corresponding to a read latency.

It is another object of the present invention to provide a synchronous memory capable of corresponding to a plurality of read latencies and rapidly operating in a burst mode.

It is a further object of the present invention to reduce the current consumption of memory cells during a reading operation based on a burst sequence.

According to the present invention, there is provided with a semiconductor memory device comprising:

a plurality of memory cell sub-array groups, each of which comprises a memory cell sub-array including a plurality of memory cells which are arranged at cross portions of a plurality of bit line pairs and a plurality of local word lines, a local row decoder for transmitting a row selecting signal for selecting each row of said memory cell sub-array, and a bit line peripheral circuit group including a plurality of bit line peripheral circuits which are connected to said bit line pairs of said memory cell sub-array, respectively, and to and from which said data signal transmitted by said bit line pairs are inputted and outputted;

a global row decoder for decoding an inputted address to a row selecting signal for selecting the memory cells in each row of each of the memory cell sub-arrays, to output said row selecting signal to each of said local row decoders via a global word line;

a column decoder for decoding said input address to a column selecting signal for selecting the memory cells in each column of each of said memory cell sub-arrays, to output said column selecting signal to each of said bit line peripheral circuits via a plurality of column selecting signal lines;

a block decoder for decoding said inputted address to a first block selecting signal, which is the base of a signal for selecting each of said memory cell sub-arrays, to output said first block selecting signal;

a burst counter for sequentially automatically generating an address of a predetermined bit number in synchronism with a clock on the basis of a predetermined sequence in the subsequent operation cycle in accordance with the inputted initial address, to output the generated address to said block decoder;

a plurality of block decoder selection-time adjusting circuits for sequentially outputting said first block selecting signal, which is inputted from said block decoder, as a second block selecting signal at a timing corresponding to a read latency and for outputting said first block selecting signal as a third block selecting signal which is a signal having a length corresponding to said read latency and which is inputted to each of said local row decoders to controls the transmission of said row selecting signal based on each of said local row decoders;

a plurality of block switches, each of which is connected to said bit line peripheral circuits of a corresponding one of said bit line peripheral circuit groups via a local data line pair and which controls the propriety of the input/output of data via said local data line pair in response to the input of said second block selecting signal;

a data bus pair which is connected to each of said bit line pairs via a corresponding one of said block switches; and a reading circuit for reading data out of each of said memory cells via said bit line pairs, bit line peripheral circuits, local data line pairs, block switches and data bus pair, to amplify and output the read data.

In summary, according to a semiconductor memory device of the present invention, the reading operation in each of operation cycles based on a burst sequence corresponding to a read latency is the same sequence, so that it is possible to realize the simplification of a system circuit and the facilitation of an operation analysis according thereto. It is also possible to provide a synchronous memory capable of corresponding to a plurality of read latencies and rapidly operating in a burst mode. Moreover, it is possible to reduce the current consumption of memory cells during a reading operation based on a burst sequence.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

The schematic construction of a semiconductor memory device according to the present invention will be described below.

In the semiconductor memory device according to the present invention, a memory cell array is divided into a plurality of memory cell sub-arrays, and the selection time (cycle) of local word lines is set so as to correspond to a read latency. The memory cell sub-arrays are connected to a global bus line via a switch, and the collision of data is prevented by the on-off control of the switch based on a burst sequence, so that a plurality of local word lines can be selected. By thus allowing the plurality of local word lines to be selected, it is possible to realize the acceleration of a reading operation corresponding to a read latency. In addition, by carrying out the on-off control of the switch by the burst sequence, it is possible to accelerate a reading operation in a burst mode.

Referring now to the accompanying drawings, a preferred embodiment of a synchronous SRAM serving as a semiconductor memory device according to the present invention will be described below.

Figure 1:
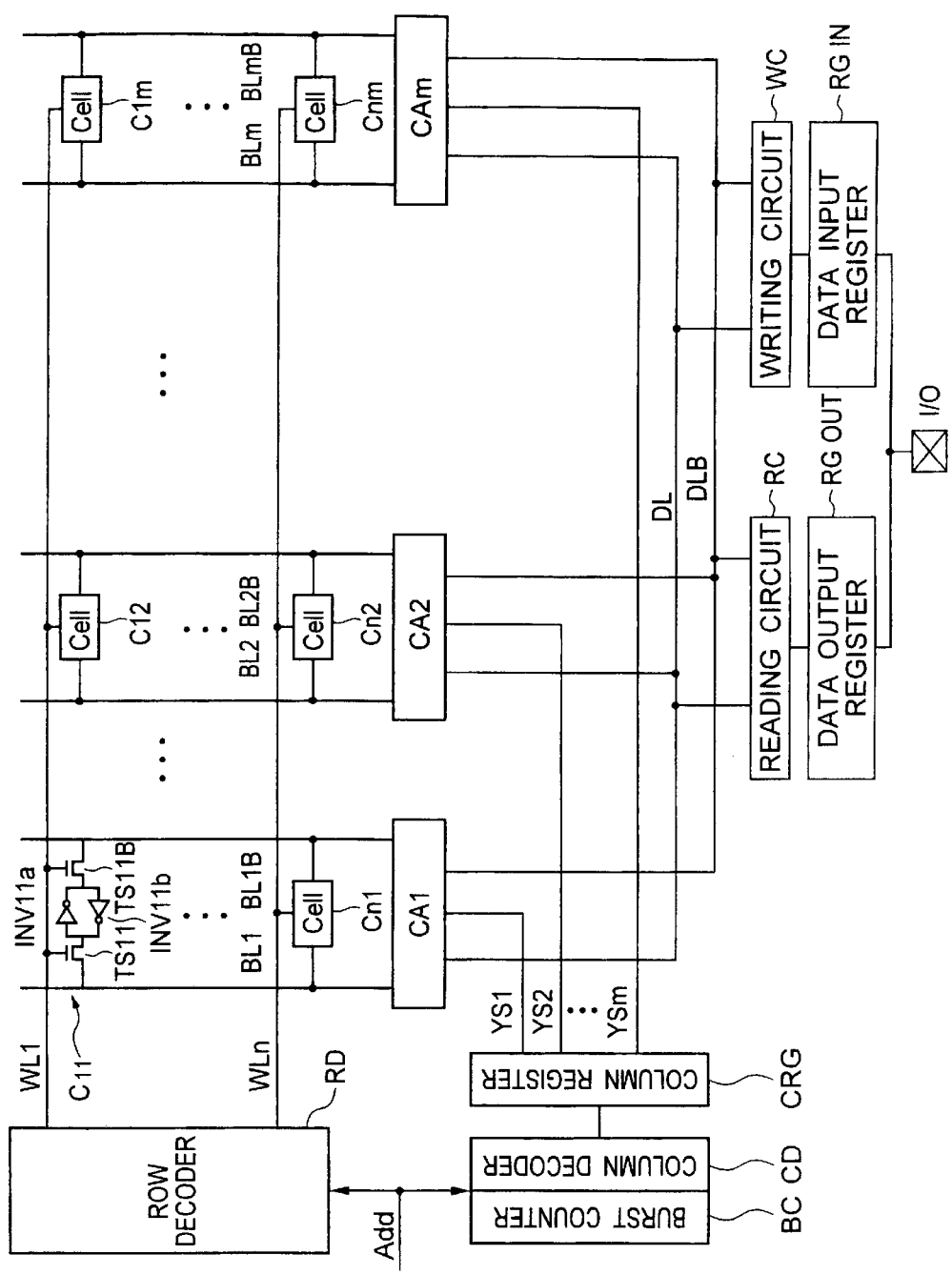
FIG. 1 is a block diagram showing the construction of a conventional synchronous SRAM.
Figure 2:
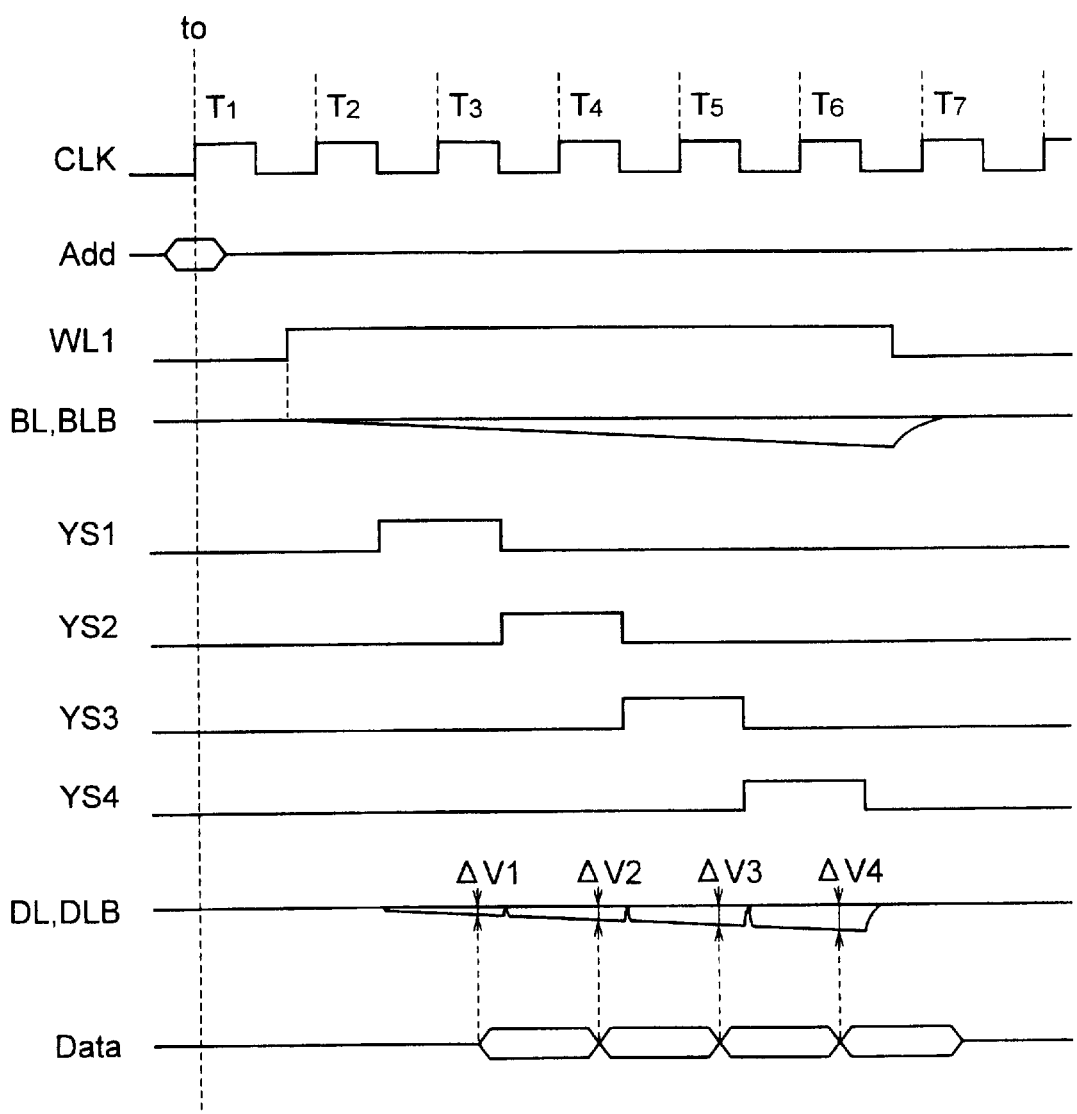
FIG. 2 is a timing chart showing the waveforms of principal signals in the conventional synchronous SRAM shown in FIG. 1.
Figure 3:
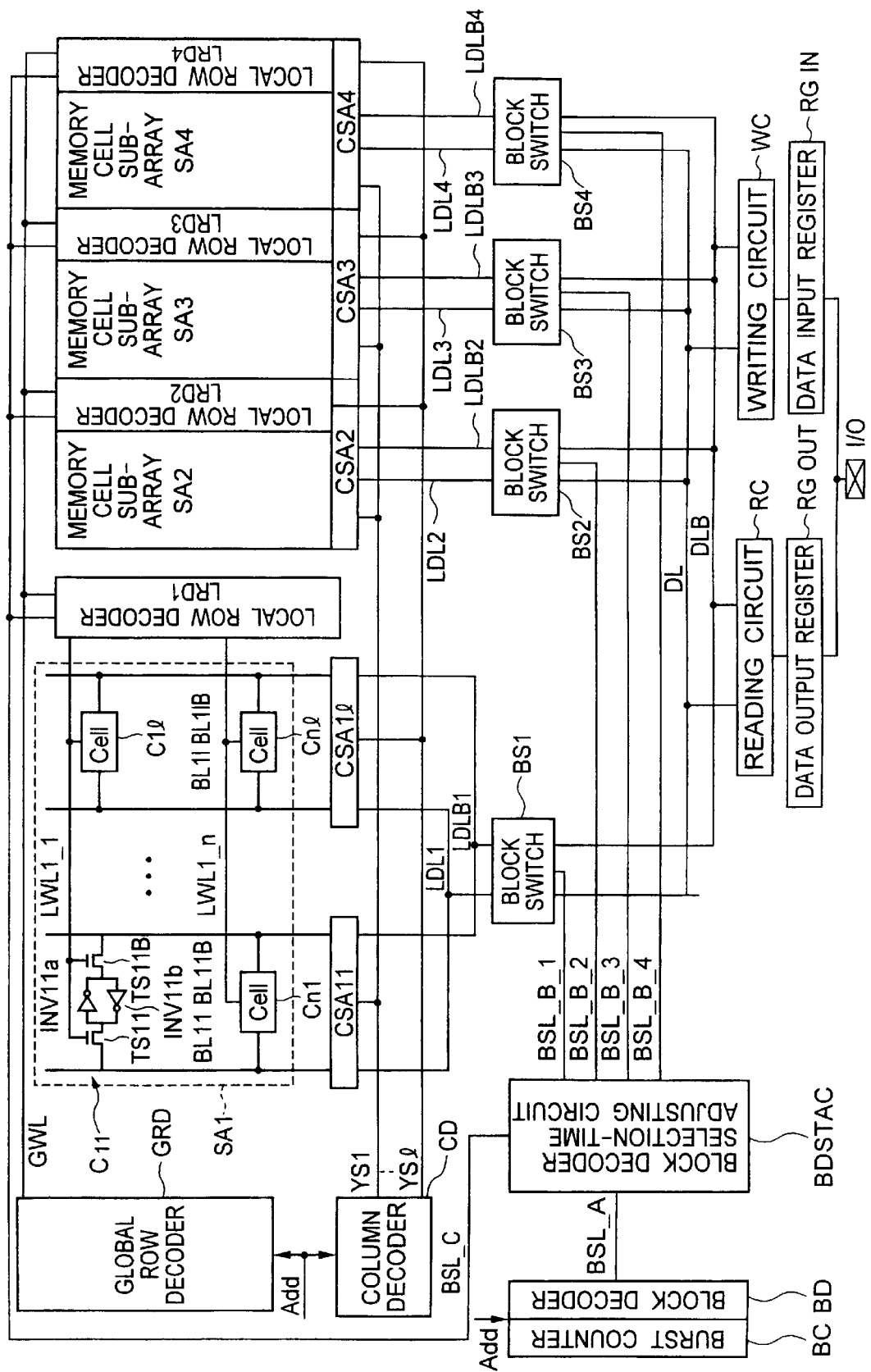
FIG. 3 is a block diagram showing the construction of a preferred embodiment of a synchronous SRAM according to the present invention.

FIG. 3 is a block diagram showing the construction of a preferred embodiment of a synchronous SRAM according to the present invention.

In the preferred embodiment of a synchronous SRAM according to the present invention shown in FIG. 3, a memory cell is divided into four memory cell sub-array groups. That is, the memory cell array including n×m memory cells is divided into the four memory cell sub-array groups including n×l (4=m) memory cells.

The first memory cell sub-array group comprises: a first memory cell sub-array SA1 including n×l memory cells C11, . . . , Cn1 which are arranged in the form of a matrix; a first local row decoder LRD1 for transmitting a row selecting signal for selecting a memory cell in each row of the first memory cell sub-array SA1; local word lines LWL1-1, . . . , LWL1-n, connected to the memory cells in each row of the first memory cell sub-array SA1 and to the first local row decoder LRD1, respectively, for transmitting a row selecting signal; bit line pairs BL11, BL11B, . . . ,BL11, BL11B which are connected to the memory cells in each column of the first memory cell sub-array SA1, respectively and which comprise bit lines and inversion-side bit lines for transmitting a data signal when data of the memory cells are inputted or outputted; and a first bit line peripheral circuit group CSA1 which is connected to the respective bit line pairs of the first memory cell sub-array SA1, respectively and which comprises bit line peripheral circuits CSA11, . . . , CSA11, to and from which the data signals transmitted by the bit line pairs are inputted and outputted.

The second memory cell sub-array group comprises: a second memory cell sub-array SA2 including n×l memory cells C1(l+1), . . ., Cn(2l) which are arranged in the form of a matrix; a second local row decoder LRD2 for transmitting a row selecting signal for selecting a memory cell in each row of the second memory cell sub-array SA2; local word lines LWL2-1, . . . , LWL2-n, connected to the memory cells in each row of the second memory cell sub-array SA2 and to the second local row decoder LRD2, respectively, for transmitting a row selecting signal; bit line pairs BL21, BL21B, . . . , BL2l, BL2lB which are connected to the memory cells in each column of the second memory cell sub-array SA2, respectively and which comprise bit lines and inversion-side bit lines for transmitting a data signal when data of the memory cells are inputted or outputted; and a second bit line peripheral circuit group CSA2 which is connected to the respective bit line pairs of the second memory cell sub-array SA2, respectively and which comprises bit line peripheral circuits CSA21, . . . , CSA2l, to and from which the data signals transmitted by the bit line pairs are inputted and outputted.

The third memory cell sub-array group comprises: a third memory cell sub-array SA3 including n×l memory cells C1(2l+1), . . . , Cn(3l) which are arranged in the form of a matrix; a third local row decoder LRD3 for transmitting a row selecting signal for selecting a memory cell in each row of the third memory cell sub-array SA3; local word lines LWL3-1, . . . , LWL3-n, connected to the memory cells in each row of the third memory cell sub-array SA3 and to the third local row decoder LRD3, respectively, for transmitting a row selecting signal; bit line pairs BL31, BL31B, . . . , BL3l, BL3lB which are connected to the memory cells in each column of the third memory cell sub-array SA3, respectively and which comprise bit lines and inversion-side bit lines for transmitting a data signal when data of the memory cells are inputted or outputted; and a third bit line peripheral circuit group CSA3 which is connected to the respective bit line pairs of the third memory cell sub-array SA3, respectively and which comprises bit line peripheral circuits CSA31, . . . , CSA3l, to and from which the data signals transmitted by the bit line pairs are inputted and outputted.

The fourth memory cell sub-array group comprises: a fourth memory cell sub-array SA4 including n×l memory cells C1(3l+1), . . . , Cn(4l) which are arranged in the form of a matrix; a fourth local row decoder LRD4 for transmitting a row selecting signal for selecting a memory cell in each row of the fourth memory cell sub-array SA4; local word lines LWL4-1, . . . , LWL4-n, connected to the memory cells in each row of the fourth memory cell sub-array SA4 and to the fourth local row decoder LRD4, respectively, for transmitting a row selecting signal; bit line pairs BL41, BL41B, . . . , BL4l, BL4lB which are connected to the memory cells in each column of the fourth memory cell sub-array SA4, respectively and which comprise bit lines and inversion-side bit lines for transmitting a data signal when data of the memory cells are inputted or outputted; and a fourth bit line peripheral circuit group CSA4 which is connected to the respective bit line pairs of the fourth memory cell sub-array SA4, respectively and which comprises bit line peripheral circuits CSA41, . . . , CSA4l, to and from which the data signals transmitted by the bit line pairs are inputted and outputted.

The synchronous SRAM according to the present invention comprises: a global row decoder GRD for decoding an inputted address to a row selecting signal for selecting a memory cell in each row of each of the memory cell sub-arrays, to output the row selecting signal to each of the local row decoders via a global word line GWL; a column decoder CD for decoding the input address to a column selecting signal for selecting a memory cell in each column of each of the memory cell sub-arrays, to output the column selecting signal to the respective bit line peripheral circuits via column selecting signal lines YS1, . . . , YSl; a block decoder BD for decoding the inputted address to a block selecting signal BSL__A, which is the base of a signal for selecting the respective memory cell sub-arrays, to output the block selecting signal BSL__A; a burst counter BC for sequentially automatically generating an address of a predetermined bit number in synchronism with a clock on the basis of a predetermined sequence in the subsequent operation cycle in accordance with the inputted initial address, to output the generated address to the block decoder BD; and a block decoder selection-time adjusting circuit BDSTAC for sequentially outputting the block selecting signal BSL__A, which is inputted from the block decoder BD, as block selecting signals BSL__B__1, BSL__B__2, BSL__B__3 and BSL__B__4 at a timing corresponding to a read latency and for outputting the block selecting signal BSL__A as a block selecting signal BSL__C which is a signal having a length corresponding to the read latency and which is inputted to the respective local row decoders to controls the transmission of the row selecting signal based on the respective local row decoders.

The most characteristic point of the structure of the synchronous SRAM according to the present invention is that the SRAM has the block decoder selection-time adjusting circuit BDSTAC.

The synchronous SRAM according to the present invention further comprises: a first block switch BS1 which is connected to the respective bit line peripheral circuits of the first bit line peripheral circuit group CSA1 via a local data line pair LDL1 and LDLB1 and which controls the propriety of the input/output of data via the local data line pair LDL1 and LDLB1 in response to the input of the block selecting signal BSL_B_1; a second block switch BS2 which is connected to the respective bit line peripheral circuits of the second bit line peripheral circuit group CSA2 via a local data line pair LDL2 and LDLB2 and which controls the propriety of the input/output of data via the local data line pair LDL2 and LDLB2 in response to the input of the block selecting signal BSL_B_2; a third block switch BS3 which is connected to the respective bit line peripheral circuits of the third bit line peripheral circuit group CSA3 via a local data line pair LDL3 and LDLB3 and which controls the propriety of the input/output of data via the local data line pair LDL3 and LDLB3 in response to the input of the block selecting signal BSL_B_3; and a fourth block switch BS4 which is connected to the respective bit line peripheral circuits of the fourth bit line peripheral circuit group CSA4 via a local data line pair LDL4 and LDLB4 and which controls the propriety of the input/output of data via the local data line pair LDL4 and LDLB4 in response to the input of the block selecting signal BSL_B_4.

Moreover, the synchronous SRAM according to the present invention comprises: a data bus pair comprising a data bus DL and inversion-side data bus DLB which are connected to the respective bit line pairs via the respective block switches; a reading circuit RC for reading data out of the respective memory cells via the bit line pair, bit line peripheral circuit, local data line pair, block switches and data bus pair, to amplify and output the read data; a data output register RGOUT for outputting data, which are amplified by the reading circuit RC, to an input/output port I/O at a predetermined timing; a data input register RGIN for outputting data, which are inputted from the input/output port I/O, at a predetermined timing; and a writing circuit WC for amplifying and outputting data, which are inputted from the data input register RGIN, to write the data in each of the memory cells via the data bus pair, block switch, local data line pair, bit line peripheral circuits and bit line pairs.

As an example of the construction of each of the memory cells, the construction of the first-row, first-column memory cell C11 of the first memory cell sub-array SA1 will be described. The memory cell C11 comprises: first and second inverters INV11a and INV11b which are connected to each other as a cycle; a first transfer switch TS11 comprising an N-channel MOS transistor which is provided between the first-column bit line BL11 and the input node of the first inverter INV11a, and the gate of which is connected to the first-row word line WL1-1; and a first inversion-side transfer switch TS11B comprising an N-channel MOS transistor which is provided between the first-column inversion-side bit line BL11B and the input node of the second inverter INV11b, and the gate of which is connected to the first-row word line WL1-1. The first and second inverters INV11a and INV11b constitute a flip-flop. Each of the other memory cells has the same construction.

As an example of the construction of each of the bit line peripheral circuits, the construction of the bit line peripheral circuit CSA11 of the first memory cell sub-array SA1 will be described. The bit line peripheral circuit CSA11 comprises: a column switch for connecting and disconnecting between the bit line BL11 and the inversion-side bit line BL11B, and the local data line LDL1 and the inversion-side local data line LDLB1; a pre-charging circuit for pre-charging the bit line BL11 and the inversion-side bit line BL11B; and an equalizing circuit for equalizing the bit line BL11 and the inversion-side bit line BL11B. The column selecting signal is inputted to the column switch, so that the connection and disconnection between the bit line BL11 and the inversion-side bit line BL11B, and the local data line LDL1 and the inversion-side local data line LDLB1 is controlled.

The construction of the block decoder selection-time adjusting circuit BDSTAC of the synchronous SRAM according to the present invention will be described below.

Figure 4:
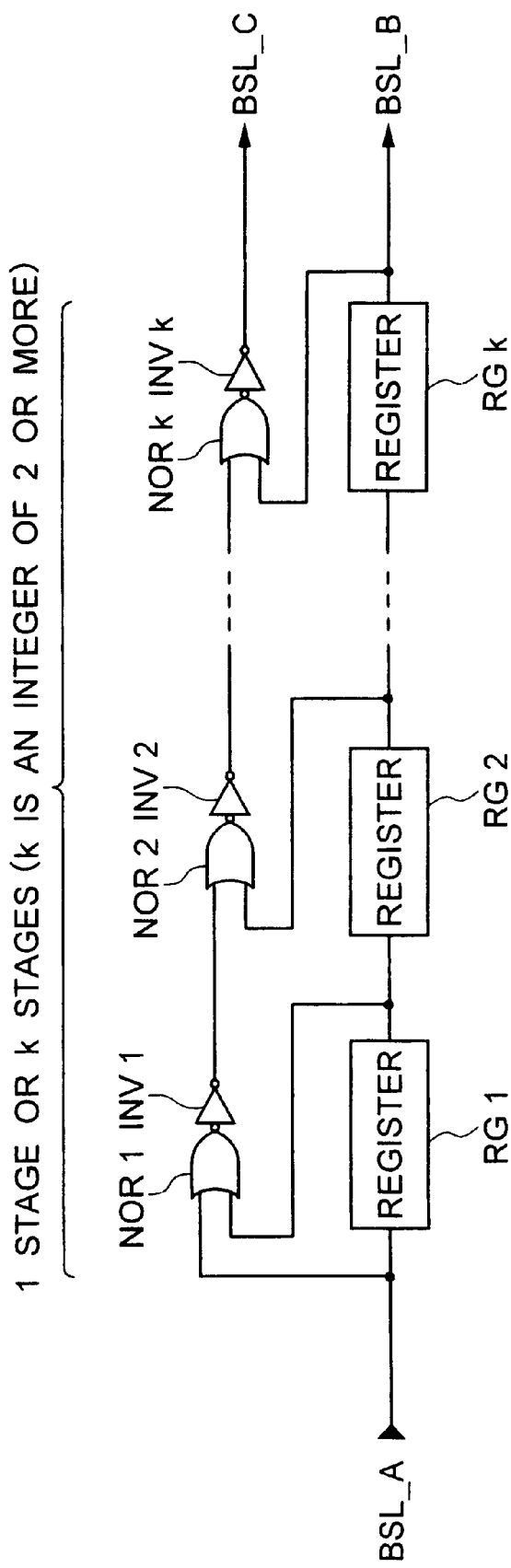
FIG. 4 is a block diagram showing the construction of a block decoder selection-time adjusting circuit BDSTAC.
Figure 5:
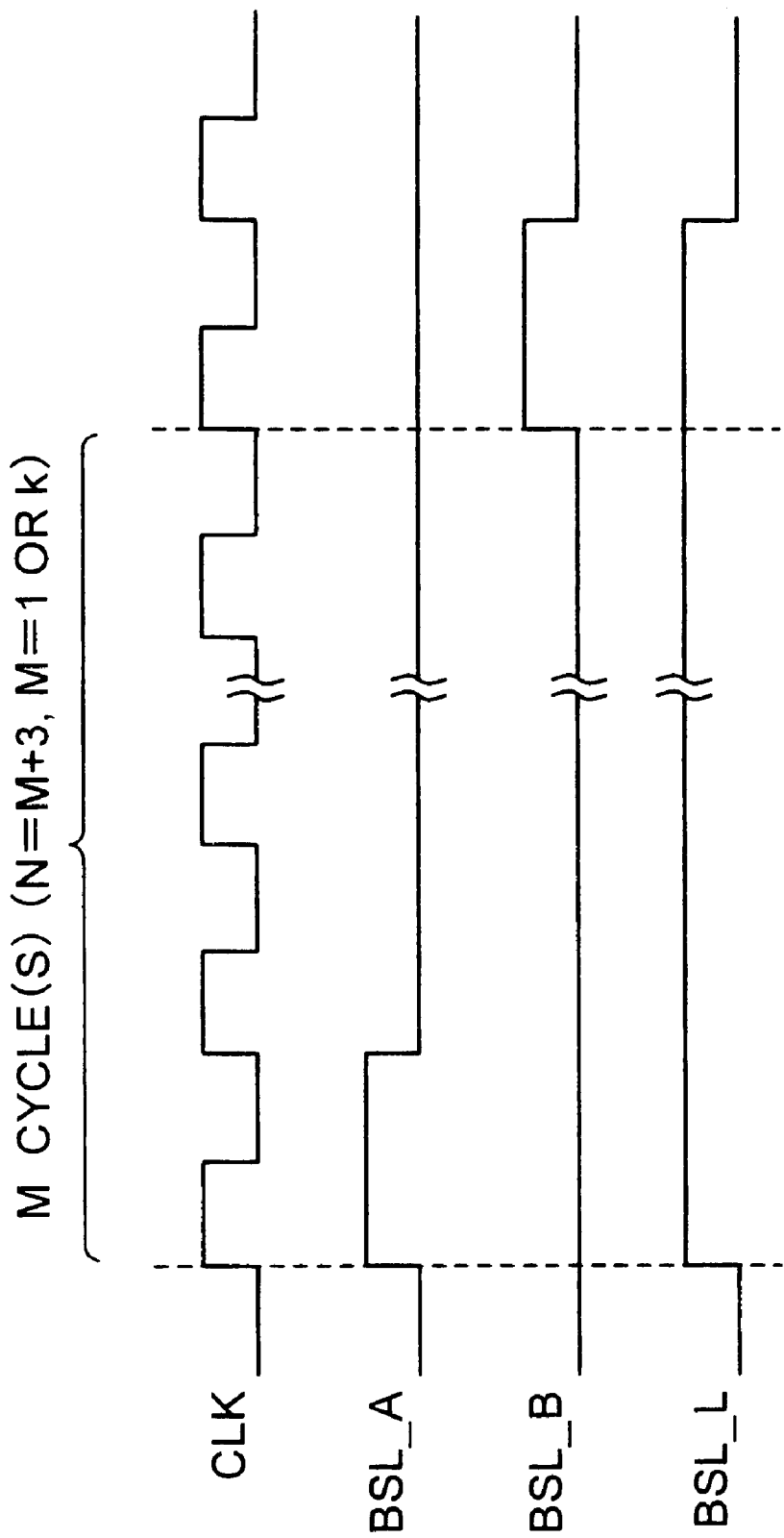
FIG. 5 is a timing chart showing the waveforms of input/output signals and a clock signal in the block decoder selection-time adjusting circuit BDSTAC.

FIG. 4 is a block diagram showing the construction of the block decoder selection-time adjusting circuit BDSTAC, and FIG. 5 is a timing chart showing the waveforms of input/output signals and a clock signal in the block decoder selection-time adjusting circuit BDSTAC.

The block decoder selection-time adjusting circuit BDSTAC comprises a plurality of stages of cascaded circuit blocks having the same construction. However, the relationship between the input and output of signals in the first stage is different from that in the second and subsequent stages.

The circuit block in the first stage comprises: a first register RG1 to which a block selecting signal BSL_A is inputted; a first two-input NOR logic gate NORI to which the block selecting signal BSL_A and the output of the first register RG1 are inputted; and a first inverter INV1 to which the output signal of the first two-input NOR logic gate NOR1 is inputted. If the block decoder selection-time adjusting circuit BDSTAC comprises only the circuit block in the first stage, the output signal of the first register RG1 is a block selecting signal BSL_B, and the output signal of the first inverter INV1 is a block selecting signal BSL_C.

The circuit block in the second and subsequent stages, e.g., the circuit block in a k-th stage (k is an integer of 2 or more), comprises: a k-th register RGk to which the output signal of a register RG (k−1) in a (k−1)-th stage is inputted; a k-th two-input NOR logic gate NORk to which the output signal of an inverter INV(k−1) in the (k−1)-th stage and the output signal of the k-th register RGk are inputted; and a k-th inverter INVk to which the output signal of the k-th two-input NOR logic gate NORk is inputted. If the final stage of the block decoder selection-time adjusting circuit BDSTAC is the circuit block in the k-th stage, the output signal of the k-th register RGk is the block selecting signal BSL_B, and the output signal of the k-th inverter INVk is the block selecting signal BSL_C.

The number M (M=1 or k) of stages of the circuit blocks is the number of stages corresponding to the read latency. Assuming herein that the read latency is N with respect to the number M of stages of the circuit blocks, the number of stages is set so as to meet the proportional relationship of N=M+3. Therefore, when the read latency is 4, the number of stages of the circuit blocks is 1, and when the read latency is 5, the number of stages of the circuit blocks is 2, so that the number of stages of the circuit blocks may be changed in accordance with the value of the set read latency.

That is, the number of cycles until the block selecting signal BSL_B has a H (High) level after a cycle in which the initial address is incorporated can be set by the above described number of stages of the circuit blocks. For example, in the case of a read latency of 4, the level of the block selecting signal BSL_B becomes the H level one cycle after the cycle in which the initial address is incorporated. On the other hand, the block selecting signal BSL_C is a signal continuously having the H level until the cycle, in which the block selecting signal BSL_B has the H level, after a cycle in which the level of the block selecting signal BSL_A from the block decoder BD becomes the H level.

The block decoder selection-time adjusting circuit BDSTAC of the synchronous SRAM according to the present invention shown in FIG. 3 is designed to sequentially output four block selecting signals BSL_B_1, BSL_B_2, BSL_B_3 and BSL_B_4 in accordance with the input of the block selecting signal BSL_A. In order to achieve this, for example, four sets of the above described block decoder selection-time adjusting circuits BDSTAC are provided for sequentially inputting the block selecting signals BSL_A to the respective block decoder selection-time adjusting circuits BDSTAC every operation cycle.

The reading operation of the above described synchronous SRAM according to the present invention will be described below.

Figure 6:
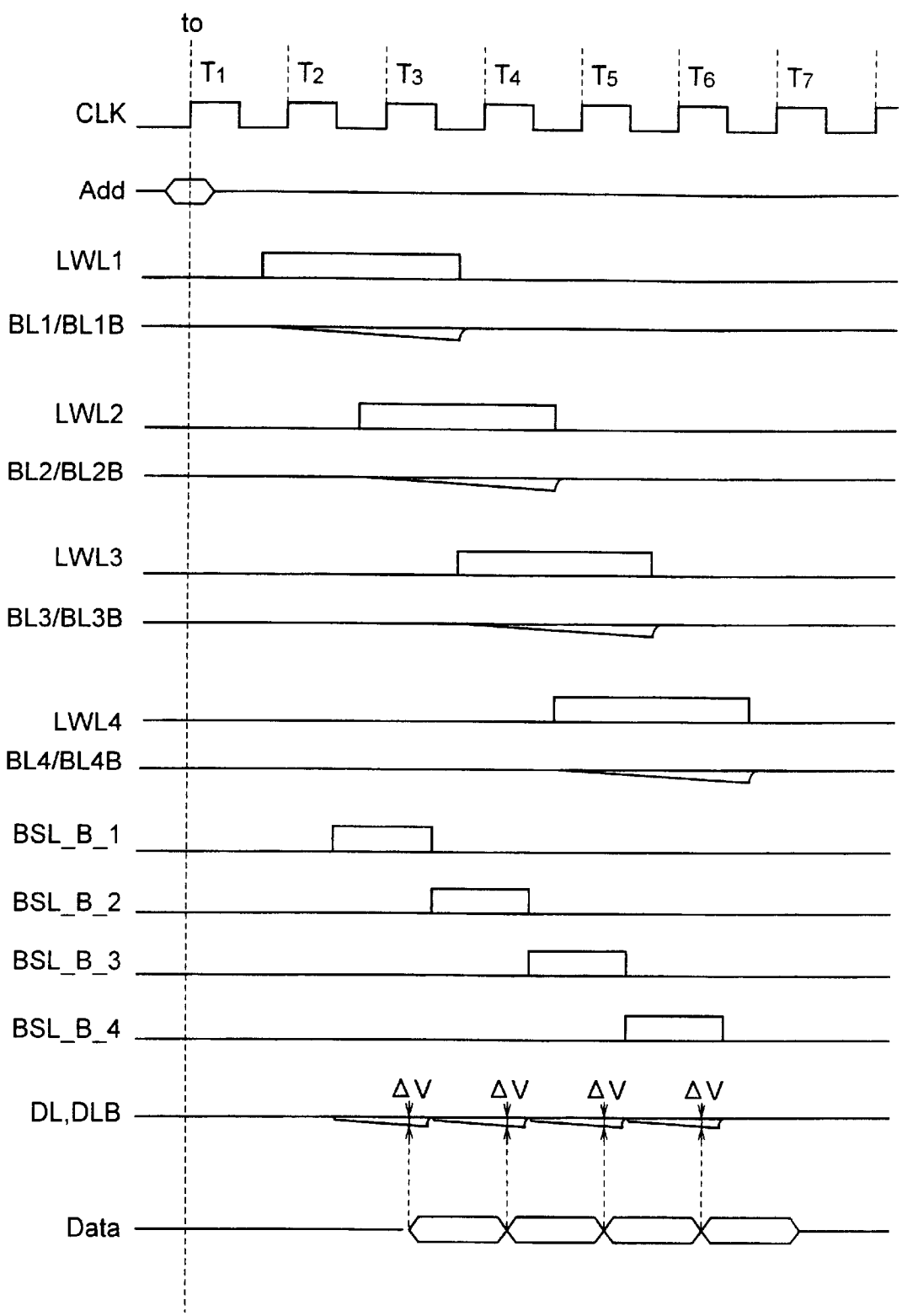
FIG. 6 is a timing chart showing the waveforms of principal signals in the synchronous SRAM according to the present invention shown in FIG. 3.

FIG. 6 is a timing chart showing the waveforms of principal signals in the synchronous SRAM according to the present invention shown in FIG. 3. The signal waveforms shown in FIG. 6 include the waveforms of a clock signal CLK, an address signal Add, row selecting signals for the first-row, second-row, third-row and fourth-row local word line LWL1, LWL2, LWL3 and LWL4 of the respective memory cell sub-arrays, potentials of the respective bit lines BL1, BL2, BL3 and BL4 and inversion-side bit lines BL1B, BL2B, BL3B and BL4B of the respective memory cell sub-arrays, the block selecting signals BSL_B_1, BSL_B_2, BSL_B_3 and BSL_B_4, potentials of data bus pair DL and DLB, and a data signal DATA in the input/output port I/O.

The read latency of 4 is herein set. Therefore, the number of stages of the circuit blocks constituting the above described block decoder selection-time adjusting circuit BDSTAC is 1.

When an address signal Add is inputted in synchronism with the leading edge of a clock signal CLK at a start time t0 in the initial cycle T1 during a reading operation in a memory cell, decode signals are generated by the global row decoder GRD, the column decoder CD and the block decoder BD, respectively. These decode signals serve as a row selecting signal, a column selecting signal, and a block selecting signal BSL_A. When the row selecting signal outputted from the global row decoder GRD, and the block selecting signal BSL_C outputted from the block decoder selection-time adjusting circuit BDSTAC in accordance with the input of the block selecting signal BSL_A are inputted to the respective local row decoders LRD, the local word line LWL1 is first selected. In addition, the column switch of the bit line peripheral circuit CSA selected by the column selecting signal is turned on.

Since the transfer switch of the memory cell C connected to the selected local word line LWL1 is turned on, a current flows into the low potential side of the memory cell C from one of the pair of bit lines via the transfer switch. As a result, the potential of one of the pair of bit lines, which have been pre-charged at a high potential and equalized, is lowered to cause a potential difference between the pair of bit lines BL1 and BL1B which are included in the first memory cell sub-array. At this time, the block selecting signal BSL__B__1 does not yet become the H level.

In the second cycle T2, the block selecting signal BSL__B__1 becomes the H level, so that the minute potential difference between the pair of bit lines BL1 and BL1B included in the first memory cell sub-array is propagated to the data bus pair DL and DLB to be inputted to the reading circuit Rc to activate the reading circuit RC to amplify the minute potential difference.

Then, in the third cycle T3, the amplified potential difference is outputted as a data signal DATA to the input/output port I/O via the data output register RGOUT. Furthermore, the reading circuit RC pre-charges and equalizes the data bus pair DL and DLB after amplifying the minute potential difference between the data bus pair DL and DLB.

Subsequently, the data signals DATA from the second, third and fourth memory cell arrays are sequentially outputted by the burst sequence. The operation based on the burst sequence will be described below.

When the initial address is inputted to the block decoder BD, an address of a predetermined bit number is inputted to the burst counter BC, the burst counter BC sequentially automatically generates an address in synchronism with a clock signal CLK on the basis of a predetermined burst sequence in the subsequent cycle. That is, in and after the second cycle T2 of FIG. 6, the burst counter BC sequentially generating a block selecting signal BSL__A in synchronism with a clock signal CLK on the basis of a predetermined burst sequence.

The block selecting signal BSL__B outputted by inputting the block selecting signal BSL__A to the block decoder selection-time adjusting circuit BDSTAC has the H level in a cycle, in which data are outputted in accordance with the read latency, and the L level in one cycle. In the construction of FIG. 3, while the block selecting signal BSL__A is sequentially automatically generated on the basis of a predetermined burst sequence, the block selecting signals BSL__B__1, BSL__B__2, BSL__B__3 and BSL__B__4 sequentially have the H level every cycle after a delay of the cycle of the read latency based on the block decoder selection-time adjusting circuit BDSTAC.

On the other hand, the level of the block selecting signal BSL__C is maintained to be the H level until the cycle for outputting data in accordance with the read latency is completed after the level of the block selecting signal BSL__A becomes the H level. That is, the level of the block selecting signal BSL__C is maintained to be the H level until the end of the cycle, in which the level of the block selecting signal BSL__B corresponding to the block selecting signal BSL__A becomes the H level, after the level of the block selecting signal BSL__A becomes the H level. Therefore, the block selecting signal BSL__C which is maintained to have the H level until the end of the cycle, in which the level of the block selecting signal BSL__B__1 becomes the H level, after the level of the block selecting signal BSL__A becomes the H level, the block selecting signal BSL__C which is maintained to have the H level until the end of the cycle, in which the level of the block selecting signal BSL__B__2 becomes the H level, after the level of the block selecting signal BSL__A becomes the H level, the block selecting signal BSL__C which is maintained to have the H level until the end of the cycle, in which the level of the block selecting signal BSL__B__3 becomes the H level, after the level of the block selecting signal BSL__A becomes the H level, the block selecting signal BSL__C which is maintained to have the H level until the end of the cycle, in which the level of the block selecting signal BSL__B__4 becomes the H level, after the level of the block selecting signal BSL__A becomes the H level, are generated, a plurality of block selecting signals BSL__C may simultaneously have the H level.

By the block selecting signal BSL__C and the row selecting signal, a local word line LWL is selected, and a minute potential difference is caused between the pair of bit lines by a cell current. In the next cycle, the reading circuit is activated to amplify the minute potential difference, and the amplified potential difference is outputted as a data signal DATA.

The minute potential difference serving as the data signal is propagated to the respective local data line pairs LDL and LDLB every cycle in accordance with the burst sequence. However, the block switches BS1, BS2, BS3 and BS4 are provided between the respective local data line pairs LDL, LDLB and the data bus pairs DL, DLB, respectively, and the plurality of block switches are not simultaneously selected, so that data do not collide with each other on the data bus pair DL, DLB.

The feature of the circuit operation of the synchronous SRAM according to the present invention is that it is possible to select memory cells over a period of more cycles in accordance with the read latency. Since the memory cell selecting state can be maintained for a longer time, the potential difference between the pair of bit lines, i.e., the data amplitude, can be increased. As a result, the operation margin of the reading circuit, which is a sense amplifier, can be improved, so that it is possible to rapidly read data.

In order to select memory cells over a period of more cycles, a plurality of local word lines must be simultaneously selected, so that it is required to avoid the problem in that data collide with each other on the data bus pair. Therefore, in the synchronous SRAM according to the present invention, as described above, the block switches are provided between the respective local data line pairs and the data bus pairs, respectively, and these block switches are sequentially selected, so that the collision of data is avoided.

In the memory cell reading operation of the synchronous SRAM according to the present invention, all of operation sequences based on the burst address are the same until the output of data via the data output register, from the decoding of addresses and the activation of the reading circuit. Therefore, it is possible to rapidly carry out a memory data reading operation in the burst mode, and it is possible to prevent the design of circuits and the internal timing control from being complicated. As a result, it is possible to decrease the number of items, which should be taken into consideration in the operation analysis, and it is possible to facilitate the operation analysis.

In addition, only by changing the number of stages of the circuit blocks in the block decoder selection-time adjusting circuit BDSTAC, it is possible to change the setting of the read latency, and it is possible to carry out a rapid reading operation corresponding to the read latency. Moreover, since the number of selections of memory cells in the burst sequence operation is smaller than that in the prior art, the current consumption due to the cell current reduces at a ratio of (N−2)/(L+N+1) as compared with the prior art, wherein N is a value of read latency, which is an integer of 3 or more, and L is a burst bit length which is a multiplier of 2.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:

a plurality of memory cell sub-array groups, each of which comprises a memory cell sub-array including a plurality of memory cells which are arranged at cross portions of a plurality of bit line pairs and a plurality of local word lines, a local row decoder for transmitting a row selecting signal for selecting each row of said memory cell sub-array, and a bit line peripheral circuit group including a plurality of bit line peripheral circuits which are connected to said bit line pairs of said memory cell sub-array, respectively, and to and from which said data signal transmitted by said bit line pairs are inputted and outputted;

a global row decoder for decoding an inputted address to a row selecting signal for selecting the memory cells in each row of each of the memory cell sub-arrays, to output said row selecting signal to each of said local row decoders via a global word line;

a column decoder for decoding said input address to a column selecting signal for selecting the memory cells in each column of each of said memory cell sub-arrays, to output said column selecting signal to each of said bit line peripheral circuits via a plurality of column selecting signal lines;

a block decoder for decoding said inputted address to a first block selecting signal, which is the base of a signal for selecting each of said memory cell sub-arrays, to output said first block selecting signal;

a burst counter for sequentially automatically generating an address of a predetermined bit number in synchronism with a clock on the basis of a predetermined sequence in the subsequent operation cycle in accordance with the inputted initial address, to output the generated address to said block decoder;

a plurality of block decoder selection-time adjusting circuits for sequentially outputting said first block selecting signal, which is inputted from said block decoder, as a second block selecting signal at a timing corresponding to a read latency and for outputting said first block selecting signal as a third block selecting signal which is a signal having a length corresponding to said read latency and which is inputted to each of said local row decoders to controls the transmission of said row selecting signal based on each of said local row decoders;

a plurality of block switches, each of which is connected to said bit line peripheral circuits of a corresponding one of said bit line peripheral circuit groups via a local data line pair and which controls the propriety of the input/output of data via said local data line pair in response to the input of said second block selecting signal;

a data bus pair which is connected to each of said bit line pairs via a corresponding one of said block switches; and a reading circuit for reading data out of each of said memory cells via said bit line pairs, bit line peripheral circuits, local data line pairs, block switches and data bus pair, to amplify and output the read data.

2. A semiconductor memory device as set forth in claim 1, wherein said semiconductor memory device further comprising a writing circuit for amplifying and outputting inputted data to write the data in each of the memory cells via said data bus pair, block switches, local data line pairs, bit line peripheral circuits and bit line pairs.

3. A semiconductor memory device as set forth in claim 1, wherein each of said block decoder selection-time adjusting circuit comprises:

a first-stage circuit block including a first register to which said first block selecting signal is inputted, a first two-input NOR logic gate to which said first selecting signal and an output signal of said first register are inputted, and a first inverter to which an output signal of said first two-input NOR logic gate is inputted, wherein if the final stage of said block decoder selection-time adjusting circuit is said first circuit block, said output signal of said first register is said second block selecting signal, and said output signal of said first inverter is said third block selecting signal; and a k-th stage circuit block (k is an integer of 2 or more) including a k-th register to which an output signal of a (k−1)-th stage register is inputted, a k-th two-input NOR logic gate to which an output signal of said (k−1) stage register and an output signal of said k-th register are inputted, and a k-th inverter to which an output signal of said k-th two-input NOR logic gate is inputted, wherein if the final stage of said block decoder selection-time adjusting circuits is said k-th stage circuit block, said output signal of said k-th register is said second block selecting signal, and said output signal of said k-th register is said third block selecting signal.

4. A semiconductor memory device as set forth in claim 3, wherein the number M (M=1 or k) of stages of said circuit blocks of each of said block decoder selection-time adjusting circuits is set in accordance with a read latency.

5. A semiconductor memory device as set forth in claim 3, wherein the number M (M=1 or k) of stages of said circuit blocks of each of said block decoder selection-time adjusting circuits is set so as to be in proportion to a read latency.

6. A semiconductor memory device as set forth in claim 3, wherein the number M (M=1 or k) of stages of said circuit blocks of each of said block decoder selection-time adjusting circuits is set so as to meet a proportional relationship of N=M+3 assuming that a read latency is N.

7. A semiconductor memory device as set forth in claim 3, wherein the number M (M=1 or k) of stages of said circuit blocks of each of said block decoder selection-time adjusting circuits is set to be equal to each other.

8. A semiconductor memory device as set forth in claim 1, wherein said second block selecting signal is a signal which is outputted the number of cycles corresponding to a read latency after a cycle in which said first block selecting signal is inputted to each of said block decoder selection-time adjusting circuits, and said third block selecting signal is a signal for maintaining a selected state until the end of a cycle the number of cycles corresponding to the read latency after the cycle in which said first block selecting signal is inputted to each of said block decoder selection-time adjusting circuits.

9. A semiconductor memory device as set forth in claim 1, wherein the number of said plurality of block decoder selection-time adjusting circuits corresponds to said plurality of memory cell sub-array groups and said plurality of block switches, and wherein said first block selecting signal is sequentially inputted to each of said block decoder selection-time adjusting circuit every cycle.

10. A semiconductor memory device as set forth in claim 1, wherein each of said bit line peripheral circuits comprises:

a column switch for connecting and disconnecting between said bit line pair and said local data line pair on the basis of the input of said column selecting signal;

a pre-charging circuit for pre-charging said bit line pair; and an equalizing circuit for equalizing said bit line pair.

* * * * *